United States Patent
Huang

(10) Patent No.: US 7,467,255 B2
(45) Date of Patent: Dec. 16, 2008

(54) METHOD FOR CALIBRATION OF MEMORY DEVICES, AND APPARATUS THEREOF

(75) Inventor: Hsiang-I Huang, Hsinchu (TW)

(73) Assignee: MediaTek Inc., Hsin-Chu Hsien (TW)

( * ) Notice: Subject to any disclaimer, the term of this patent is extended or adjusted under 35 U.S.C. 154(b) by 289 days.

(21) Appl. No.: 11/277,950

(22) Filed: Mar. 30, 2006

(65) Prior Publication Data
US 2007/0233942 A1  Oct. 4, 2007

(51) Int. Cl.
G06F 13/00 (2006.01)
(52) U.S. Cl. .................................. 711/105; 711/154
(58) Field of Classification Search ............... None
See application file for complete search history.

(56) References Cited

U.S. PATENT DOCUMENTS 5,283,764 A * 2/1994 Kim et al. ............. 365/222
6,885,959 B2 4/2005 Salmon et al.
2005/0226080 A1* 10/2005 Lee ..................... 365/230.03
2006/0044047 A1* 3/2006 Porter .................. 327/512
2006/0214739 A1* 9/2006 Kang .................... 331/57

OTHER PUBLICATIONS

"DDR2 SDRAM Specification.", Jedec Standard, Jan. 2005, pp. I-IV, I-104, JESD79-2B, JEDEC Solid State Technology Association, Arlington, VA, USA.

* cited by examiner

Primary Examiner—Than Nguyen
(74) Attorney, Agent, or Firm—Winston Hsu

(57) ABSTRACT

A memory controller for a memory device. The memory controller includes a first sensor, a second sensor, and a command generator. The first sensor detects an operating environment of the memory controller. The second sensor detects an operating status of the memory controller. The command generator is coupled to the first sensor, the second sensor, and the memory device, and facilitates the sending of commands to the memory device to calibrate the memory device when the operating environment detected by the first sensor meets a first prerequisite, and the operating status detected by the second sensor meets a second prerequisite.

19 Claims, 6 Drawing Sheets

| A9 | A8 | A7 | Operation |
|---|---|---|---|
| 0 | 0 | 0 | OCD calibration mode exit |
| 0 | 0 | 1 | Drive(1)DQ, DQS, (RDQS) high and $\overline{DQS}$ low |
| 0 | 1 | 0 | Drive(0)DQ, DQS, (RDQS) low and $\overline{DQS}$ high |
| 1 | 0 | 0 | Adjust mode |
| 1 | 1 | 1 | OCD calibration default |

Fig. 2 Related Art

| 4 bit burst code inputs to all DQs | | | | Operation | |
|---|---|---|---|---|---|
| D_{T0} | D_{T1} | D_{T2} | D_{T3} | Pull-up driver strength | Pull-down driver strength |
| 0 | 0 | 0 | 0 | NOP (No operation) | NOP (No operation) |
| 0 | 0 | 0 | 1 | Increase by 1 step | NOP |
| 0 | 0 | 1 | 0 | Decrease by 1 step | NOP |
| 0 | 1 | 0 | 0 | NOP | Increase by 1 step |
| 1 | 0 | 0 | 0 | NOP | Decrease by 1 step |
| 0 | 1 | 0 | 1 | Increase by 1 step | Increase by 1 step |
| 0 | 1 | 1 | 0 | Decrease by 1 step | Increase by 1 step |
| 1 | 0 | 0 | 1 | Increase by 1 step | Decrease by 1 step |
| 1 | 0 | 1 | 0 | Decrease by 1 step | Decrease by 1 step |
| Other combinations | | | | Reserved | |

Fig. 3 Related Art

METHOD FOR CALIBRATION OF MEMORY DEVICES, AND APPARATUS THEREOF

BACKGROUND

The present invention relates to memory devices, and more particularly, to a method and related apparatus for the calibration of memory devices.

Memory is an important element found in many types of electronic devices. With recent rapid technological improvements, an increased number of DRAMs are now supplied as a common memory type of electronic devices. There are several kinds of DRAMs currently available on the market. For example, a synchronous DRAM (also referred to as SDRAM) is a kind of DRAM that can be continuously written to and read from at high speeds in synchronism with the clock of the interface (the read/write process is also referred to as a burst transfer). A double data rate SDRAM (also referred to as DDR SDRAM) is a kind of DRAM that has a doubled burst transfer speed by executing the burst transfer of the SDRAM in synchronism with both the leading edge and the trailing edge of the clock signal. Since SDRAMs constitute an inexpensive and large-capacity memory source, their usage is becoming more commonly employed in electronic devices.

A mechanism can be provided for calibration during system initialization within a memory device. For example, according to JEDEC Standard No. 79-2B, the Off-Chip driver (OCD) impedance of a DDR2 SDRAM can be adjusted during system initialization. More specifically, by using Extended Mode Register Set (EMRS) commands, the OCD impedance adjustment process of the DDR2 SDRAM can be achieved during system initialization. FIG. 1 shows a flowchart of the OCD impedance adjustment process according to JEDEC Standard No. 79-2B.

According to JEDEC Standard No. 79-2B, the OCD impedance adjustment can be done using two EMRS modes: a drive mode and an adjust mode. In the drive mode, all outputs are driven by the DDR2 SDRAM. More specifically, in Drive(1) mode, all DQ, DQS (and RDQS) signals are driven high and all /DQS signals are driven low. In Drive(0) mode, all DQ, DQS (and RDQS) signals are driven low and all /DQS signals are driven high. In the adjust mode, the OCD impedance value is adjusted according to the driving result of the drive mode. FIG. 2 and FIG. 3 show function tables of the OCD drive mode and OCD adjust mode, respectively.

FIG. 4 shows a conventional memory system 400 comprising a memory controller 410 and a memory device 450, which is a DDR2 SDRAM in this example. According to JEDEC Standard No. 79-2B, the OCD impedance adjustment process is performed during system initialization. The goal of OCD impedance adjustment is that the pull-up and pull-down driving strengths of the output drivers 460 and 470 of the DDR2 SDRAM 450 are optimized. In the memory controller 410, the command generator 430 has the task of sending control commands (such as read, write, and EMRS commands) to the DDR2 SDRAM 450. Through the EMRS commands, the memory controller 410 can adjust the OCD impedance of the DDR2 SDRAM 450 so as to optimize the driving strengths of the output drivers 460 and 470. The OCD detector 420 is in charge of detecting the voltage levels of the signals outputted by the output drivers 460 and 470. If the voltage levels of the signals outputted by output drivers 460 and 470 are within required target range when the DDR2 SDRAM 450 is in drive mode, then the calibration process will be completed and the memory system 400 can undergo normal operation. If the voltage levels of the signals from output drivers 460 and 470 are not within the required target range, the command generator 430 will then send EMRS commands to the DDR2 SDRAM 450 in order to adjust the OCD impedance value and force the DDR2 SDRAM 450 into drive mode. The OCD detector 420 will then re-test the received voltage levels. The calibration process will continue until the voltage levels are adjusted to the required target range.

Memory systems of the related art only perform the calibration process during system initialization. For example, a memory system including a DDR2 SDRAM performs the OCD impedance calibration procedure only during system initialization. This will ensure that the pull-up and pull-down driving strengths of the output drivers of the DDR2 SDRAM are optimized only at the beginning of system operation. However, throughout system operations, the operating environment (including operating voltages and temperature) may change from time to time. This variation during system operation may cause the pull-up and pull-down driving strengths of the output drivers on the DDR2 SDRAM to fluctuate. After a long usage of the memory system, the device may become unstable due to inaccurate output driving strengths, potentially causing the memory system to crash. Therefore, there is a need to provide a new mechanism that ensures optimal operation for memory systems throughout system operation without sacrificing performance.

SUMMARY

According to the claimed invention, a memory controller for controlling a memory device is disclosed. The memory controller comprises a first sensor, a second sensor, and a command generator. The first sensor detects the operating environment of the memory controller. The second sensor detects the operating status of the memory controller. The command generator is coupled to the first sensor, the second sensor, and the memory device, and sends commands to the memory device to calibrate the memory device when the operating environment detected by the first sensor meets a first prerequisite and the operating status detected by the second sensor meets a second prerequisite.

According to the claimed invention, an apparatus for controlling a memory device is disclosed. The apparatus comprises a first sensor and a memory controller. The first sensor detects an operating environment of the memory device. The memory controller is coupled to the first sensor and the memory device and comprises a second sensor and a command generator. The second sensor detects the operating status of the memory controller. The command generator is coupled to the first sensor, the second sensor, and the memory device, and sends commands to the memory device to calibrate the memory device when the operating environment detected by the first sensor meets a first prerequisite, and the operating status detected by the second sensor meets a second prerequisite.

According to the claimed invention, a method for calibrating a memory device is disclosed. The memory device is controlled by a memory controller. The method comprises detecting an operating environment of the memory controller, detecting an operating status of the memory device, determining whether the detected operating environment meets a first prerequisite and whether the detected operating status meets a second prerequisite, and sending commands to the memory device to calibrate the memory device when the detected operating environment meets the first prerequisite and the detected operating status meets the second prerequisite.

According to the claimed invention, a method for calibrating a memory device is disclosed. The method comprises detecting an operating environment of the memory device, detecting an operating status of the memory device, determining whether the detected operating environment meets a first prerequisite and whether the detected operating status meets a second prerequisite, and sending commands to the memory device to calibrate the memory device when the detected operating environment meets the first prerequisite and the detected operating status meets the second prerequisite.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 shows the function table of the OCD drive mode according to JEDEC Standard No. 79-2B.

FIG. 3 shows the function table of the OCD adjust mode according to JEDEC Standard No. 79-2B.

DETAILED DESCRIPTION

Figure 5:
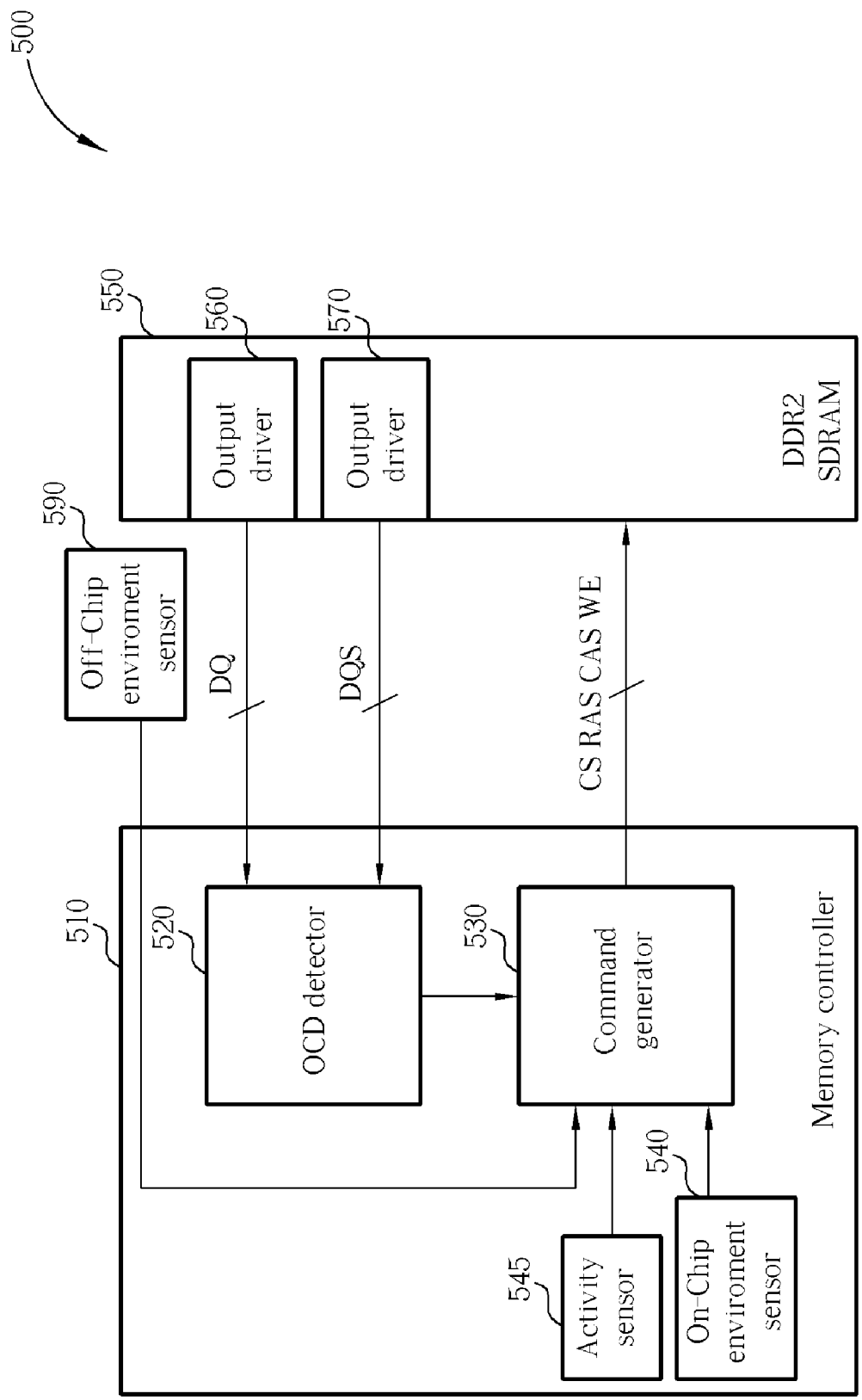
FIG. 5 shows a memory system according to a first embodiment.

FIG. 5 shows a memory system according to a first embodiment. The memory system 500 comprises a memory controller 510, a memory device 550, and an off-chip environment sensor 590. A DDR2 SDRAM serves as an example of the memory device 550, the operating environment of which is detected by the off-chip environment sensor 590. The memory controller 510 is in charge of controlling the DDR2 SDRAM 550 and comprises an OCD detector 520, a command generator 530, an on-chip environment sensor 540, and an activity sensor 545. The OCD detector 520 detects driving strengths of the output drivers 560 and 570 of the DDR2 SDRAM 550. The on-chip environment sensor 540 detects an operating environment of the memory controller 510. The activity sensor 545 detects an operating status of the memory controller 510. With the inclusion of the on-chip environment sensor 540, the off-chip environment sensor 590, and the activity sensor 545, the memory system 500 can adequately perform the OCD impedance calibration processes both during and after system initialization.

During system initialization the memory controller 510 can appropriately calibrate the OCD impedance value of the DDR2 SDRAM 550. This is accomplished by using the command generator 530 to send EMRS commands to the DDR2 SDRAM 550, and using the OCD detector 520 to detect the driving strengths of the output drivers 560 and 570.

After system initialization, the off-chip environment sensor 590 is used to detect the operating environment of the DDR2 SDRAM 550. From herein, the term "operating environment of the DDR2 SDRAM 550" may be referred to the operating voltage and/or temperature of the DDR2 SDRAM 550. By detecting the operating voltage and/or temperature of the DDR2 SDRAM 550, the requirement for re-calibration on the OCD impedance of the DDR2 SDRAM 550 can be determined. More specifically, when the operating environment detected by the off-chip environment sensor 590 meets a programmed prerequisite, such as the temperature of the DDR2 SDRAM 550 being greater than a threshold value, it can be determined that re-calibration on the OCD impedance of the DDR2 SDRAM 550 is necessary. A ring oscillator is a circuit component that can be used to implement the off-chip environment sensor 590, of which the oscillating frequency can be used to determine the operating environment of the DDR2 SDRAM 550.

The advantage of using the off-chip environment sensor 590 is that by virtue of being adjacent to the DDR2 SDRAM 550, the off-chip environment sensor 590 can accurately detect the operating environment of the DDR2 SDRAM 550. The close proximity of the off-chip environment sensor 590 with the DDR2 SDRAM 550 helps to eliminate potential external disturbances which may inadvertently alter any readings, and helps accurately determine whether re-calibration on the OCD impedance of the DDR2 SDRAM 550 is necessary.

The off-chip environment sensor 590 requires several I/O pins, such as additional general-purpose I/O pins, to report detected conditions to the memory controller 510. For systems that comprise an external bus, such as an I2C bus, the off-chip environment sensor 590 can directly utilize the external bus to communicate with the memory controller 510 without requiring additional I/O pins.

Similarly, after system initialization, the on-chip environment sensor 540 continues to detect the operating environment of the memory controller 510. This includes monitoring conditions such as the operating voltage and/or temperature. Although though the on-chip environment sensor 540 detects the operating environment of the memory controller 510 rather than the operating environment of the DDR2 SDRAM 550, the result of the on-chip environment sensor 540 detection can still somewhat reflect the operating environment of the DDR2 SDRAM 550. Through detection of the operating voltage and/or temperature of the memory controller 510, the requirement for re-calibration on the OCD impedance of the DDR2 SDRAM 550 can be inferred. More specifically, when the operating environment detected by the on-chip environment sensor 540 meets a programmed prerequisite, such as the temperature of the memory controller 510 being greater than a threshold value, it can be determined that re-calibration on the OCD impedance of the DDR2 SDRAM 550 is necessary. A ring oscillator is an exemplary circuit component that can be used to implement the on-chip environment sensor 540. The oscillating frequency of the ring oscillator can be used to determine the operating environment of the memory controller 510.

In addition to the off-chip environment sensor 590 detection, the conditions from an on-chip environment sensor 540 detection can also used as a reference for determining the requirement of OCD impedance re-calibration on the DDR2 SDRAM 550. If the operating environment detected by the on-chip environment sensor 540 meets a programmed prerequisite for re-calibration, and/or the operating environment detected by the off-chip environment sensor 590 meets another programmed prerequisite for re-calibration, it can be inferred that re-calibration on the OCD impedance of the DDR2 SDRAM 550 is necessary.

Please note that although the first embodiment of memory system 500 includes both an on-chip environment sensor 540 and an off-chip environment sensor 590, the memory system of an alternate embodiment may solely comprise either an on-chip environment sensor or an off-chip environment sensor.

The activity sensor 545 is used to detect the operating status of the memory controller 510. The condition of the operating status for the memory controller 510 also helps reveal the operating status of the DDR2 SDRAM 550. More specifically, the activity sensor 545 determines whether re-calibration on the OCD impedance of the output drivers 560 and 570 is feasible or not by detecting the operating status of the memory controller 510. When the operating status detected by the activity sensor 545 meets a programmed prerequisite, such as the detected operating status corresponding to an idle status, re-calibration on the OCD impedance of the DDR2 SDRAM 550 is feasible.

The detection results from the on-chip environment sensor 540, the off-chip environment sensor 590, and the activity sensor 545 are gathered by the command generator 530. The command generator 530 may further comprise an OCD state machine, which directs the command generator 530 to perform the OCD calibration process during system initialization and the OCD re-calibration process after system initialization.

After system initialization, the OCD state machine is used to determine whether re-calibration on the OCD impedance of the DDR2 SDRAM 550 is necessary according to programmed prerequisites and the result of an on-chip environment sensor 540 detection and an off-chip environment sensor 590 detection. If the detection results of the on-chip environment sensor 540 and the off-chip environment sensor 590 meet the prerequisites for re-calibration, the OCD state machine will recognize that re-calibration on the DDR2 SDRAM 550 has become necessary. If re-calibration is not yet required, the OCD state machine will continue monitoring detection results reported by the on-chip environment sensor 540 and the off-chip environment sensor 590.

In the case where re-calibration on the DDR2 SDRAM 550 is necessary, the OCD state machine will further continue to determine whether the re-calibration process is currently feasible, taking inputs from a programmed prerequisite and the detection result of the activity sensor 545. More specifically, if the detection result of the activity sensor 540 meets the prerequisite for re-calibration (for example when the activity sensor 540 reports that the memory controller 510 is in an idle status), the OCD state machine will recognize that re-calibration of the DDR2 SDRAM 550 is feasible and will direct the command generator 530 to begin the re-calibration process. Otherwise, the OCD state machine will continue monitoring the detection result reported by the activity sensor 545 until re-calibration on the DDR2 SDRAM 550 becomes feasible.

Figure 1:
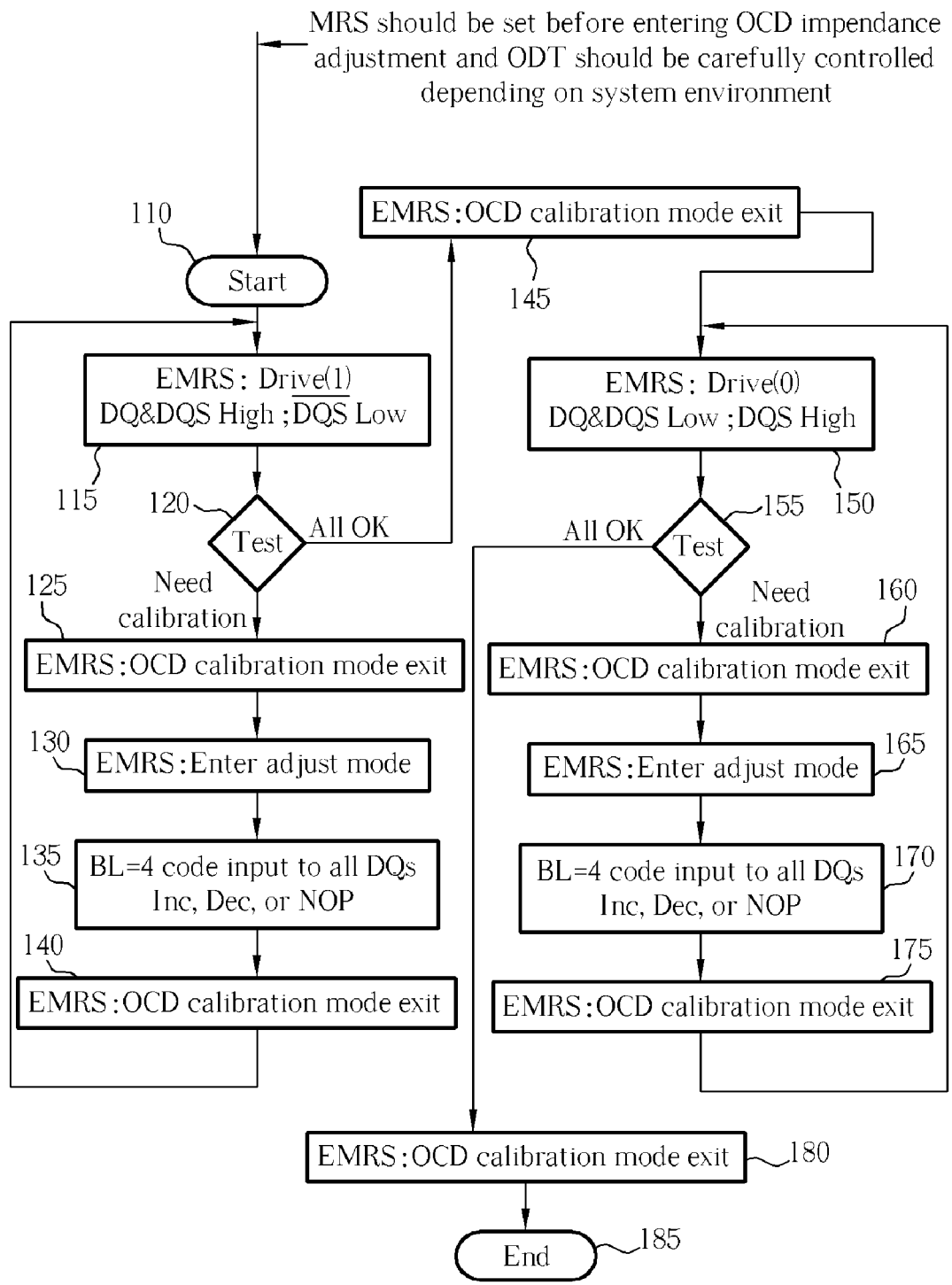
FIG. 1 shows a flowchart of the OCD impedance adjustment process according to JEDEC Standard No. 79-2B.
Figure 4:
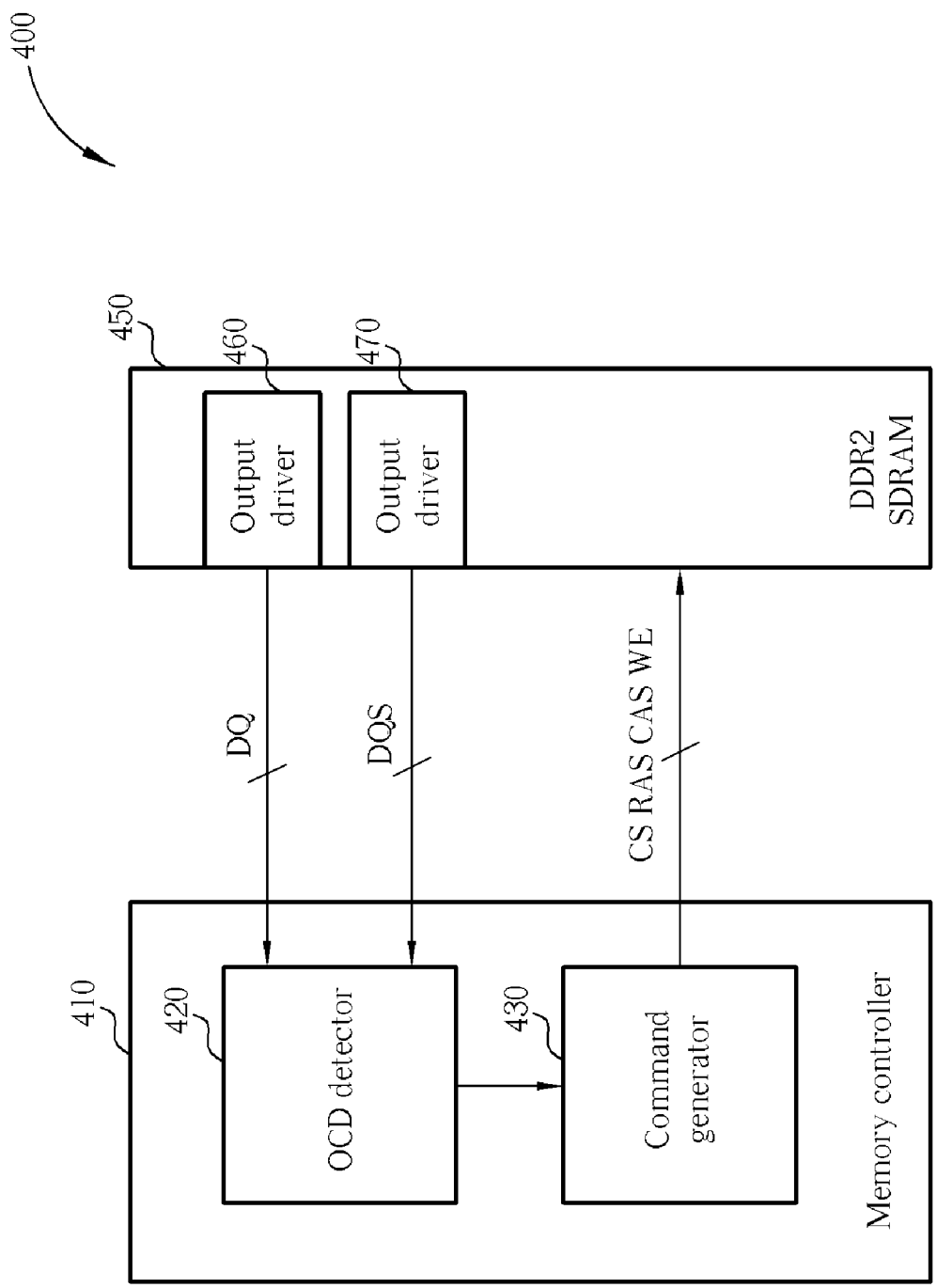
FIG. 4 shows a conventional memory system.
Figure 6:
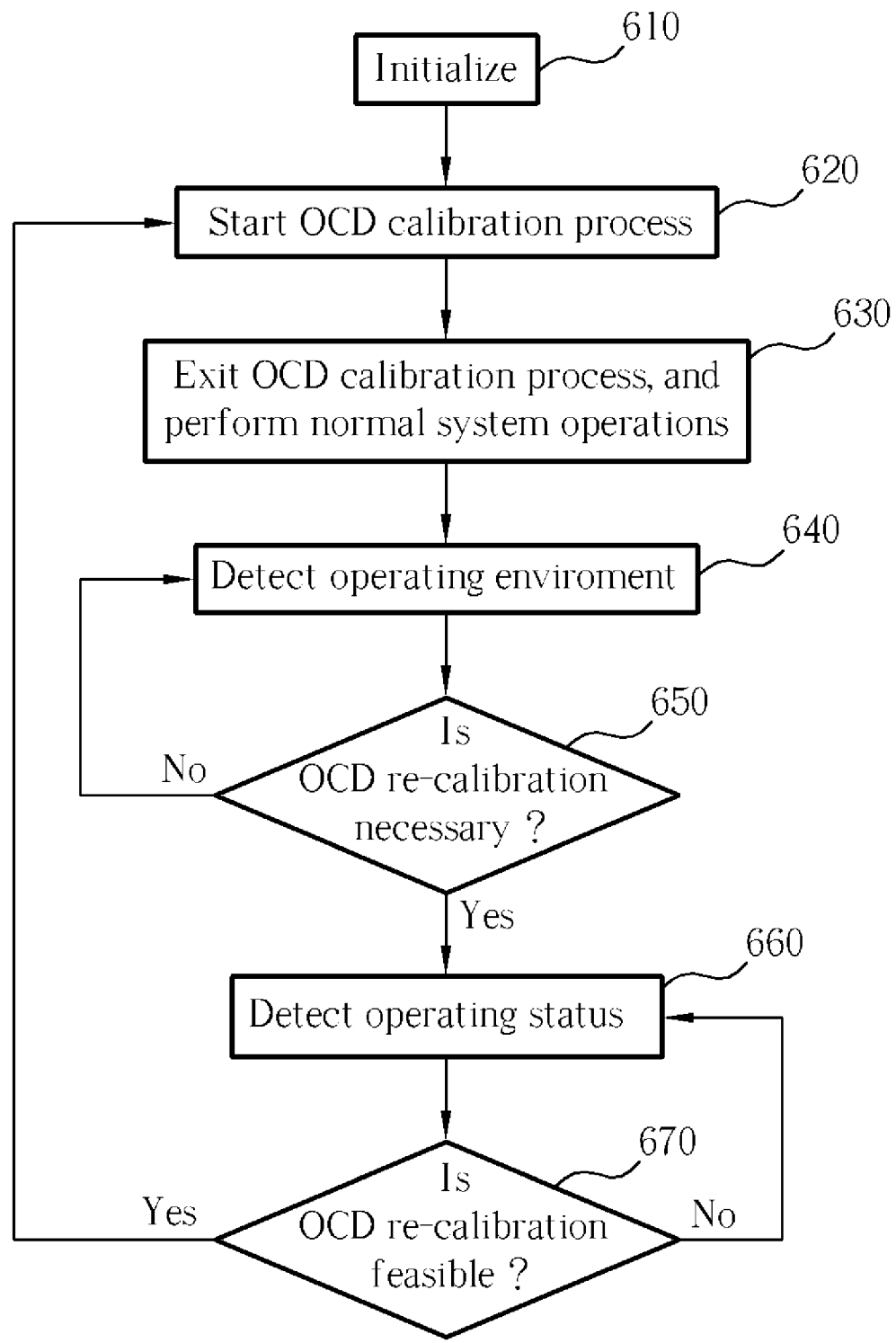
FIG. 6 shows a flow chart for the operation of the OCD state machine.

FIG. 6 shows a flow chart for the operation of the OCD state machine. At start of system operation, the OCD state machine informs the command generator 530 to perform the OCD calibration process (as described in the flowchart of FIG. 1). After the calibration process is completed, the OCD impedance of the DDR2 SDRAM 550 will be momentarily optimized. The OCD state machine then keeps track of the detection results reported by the on-chip environment sensor 540 and off-chip environment sensor 590, and determines whether re-calibration on the DDR2 SDRAM 550 is required according to the detection results reported by the on-chip environment sensor 540 and off-chip environment sensor 590. If re-calibration on the DDR2 SDRAM 550 has become necessary, the OCD state machine will continue monitoring the detection results reported by the activity sensor 545 and check whether re-calibration on the DDR2 SDRAM 550 is feasible or not according to the detection results reported by the activity sensor 545. If an idle status on the memory controller 510 and the DDR2 SDRAM 550 is reported, then re-calibration on the DDR2 SDRAM 550 will become feasible. The OCD state machine will then inform the command generator 530 to begin the re-calibration process. The command generator 530 may follow the flowchart shown in FIG. 1 to re-calibrate the OCD impedance of the DDR2 SDRAM 550.

Although a DDR2 SDRAM type memory is used as an example for the memory device 550 in this embodiment, the ideas and method of the present invention can also be applied in a memory system comprising alternate types of memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory controller for controlling a memory device, the memory controller comprising:
 a first sensor for detecting an operating environment of the memory controller without sending commands to the memory device, for determining whether to calibrate an Off-Chip driver (OCD) impedance value of the memory device;
 a second sensor for detecting an operating status of the memory controller to determine whether calibration on the OCD impedance value of the memory device is feasible; and
 a command generator, coupled to the first sensor, the second sensor, and the memory device, for sending commands to the memory device to calibrate the OCD impedance value of the memory device when the operating environment detected by the first sensor meets a first prerequisite, and the operating status detected by the second sensor meets a second prerequisite.

2. The memory controller of claim 1, wherein the first sensor comprises a ring oscillator.

3. The memory controller of claim 2, wherein whether the operating environment detected by the first sensor meets the first prerequisite is determined according to an oscillation frequency of the ring oscillator.

4. The memory controller of claim 1, wherein when the operating status detected by the second sensor corresponds to an idle status, the command generator determines that the operating status meets the second prerequisite.

5. The memory controller of claim 1, wherein the memory device is a DDR2 DRAM.

6. The memory controller of claim 5, wherein if the operating environment detected by the first sensor meets the first prerequisite, and the operating status detected by the second sensor meets the second prerequisite, the command generator sends EMRS commands to the DDR2 DRAM to calibrate the OCD impedance value of the DDR2 DRAM.

7. An apparatus for controlling a memory device, the apparatus comprising:
 a first sensor for detecting an operating environment of the memory device without sending commands to the memory device, for determining whether to calibrate an Off-Chip driver (OCD) impedance value of the memory device;
 a memory controller coupled to the first sensor and the memory device, the memory controller comprising:
  a second sensor for detecting an operating status of the memory controller to determine whether calibration on the OCD impedance value of the memory device is feasible; and
  a command generator, coupled to the first sensor, the second sensor, and the memory device, for sending commands to the memory device to calibrate the OCD impedance value of the memory device when the operating environment detected by the first sensor meets a first prerequisite and the operating status detected by the second sensor meets a second prerequisite.

8. The apparatus of claim 7, wherein the first sensor comprises a ring oscillator.

9. The apparatus of claim 8, wherein whether the operating environment detected by the first sensor meets the first prerequisite is determined according to an oscillation frequency of the ring oscillator.

10. The apparatus of claim 7, wherein when the operating status detected by the second sensor corresponds to an idle status, the command generator determines that the operating status meets the second prerequisite.

11. The apparatus of claim 7, wherein the memory device is a DDR2 DRAM.

12. The memory controller of claim 11, wherein when the operating environment detected by the first sensor meets the first prerequisite and the operating status detected by the second sensor meets the second prerequisite, the command generator sends EMRS commands to the DDR2 DRAM to calibrate the OCD impedance value of the DDR2 DRAM.

13. A method for calibrating a memory device, the memory device being controlled by a memory controller, the method comprising:
    detecting an operating environment of the memory controller without sending commands to the memory device, for determining whether to calibrate an Off-Chip driver (OCD) impedance value of the memory device;
    detecting an operating status of the memory controller to determine whether calibration on the OCD impedance value of the memory device is feasible;
    determining whether the operating environment meets a first prerequisite and whether the operating status meets a second prerequisite; and
    sending commands to the memory device to calibrate the OCD impedance value of the memory device when the operating environment meets the first prerequisite and the operating status meets the second prerequisite.

14. The method of claim 13, wherein the memory device is a DDR2 DRAM.

15. The method of claim 14, wherein the step of sending commands to the memory device to calibrate the OCD impedance value of the memory device comprises:
    sending EMRS commands to the DDR2 DRAM to adjust the OCD impedance value of the DDR2 DRAM.

16. A method for calibrating a memory device, the method comprising:
    detecting an operating environment of the memory device without sending commands to the memory device, for determining whether to calibrate an Off-Chip driver (OCD) impedance value of the memory device;
    detecting an operating status of the memory device to determine whether calibration on the OCD impedance value of the memory device is feasible;
    determining whether the operating environment meets a first prerequisite and whether the operating status meets a second prerequisite; and
    sending commands to the memory device to calibrate the OCD impedance value of the memory device when the operating environment meets the first prerequisite and the operating status meets the second prerequisite.

17. The method of claim 16, wherein the memory device is a DDR2 DRAM.

18. The method of claim 17, wherein the step of sending commands to the memory device to calibrate the OCD impedance value of the memory device comprises:
    sending EMRS commands to the DDR2 DRAM to adjust the OCD impedance value of the DDR2 DRAM.

19. A memory controller for controlling a memory device, the memory controller comprising:
    a first sensor for detecting an operating environment of the memory controller without sending commands to the memory device, for determining whether to re-calibrate an Off Chip driver (OCD) impedance value of the memory device; and
    a command generator, coupled to the first sensor and the memory device, for sending commands to the memory device to re-calibrate the OCD impedance value of the memory device when the first sensor determines to re-calibrate the memory device according to the detected operating environment.

* * * * *